US006653210B2

United States Patent
Choo et al.

(10) Patent No.: US 6,653,210 B2
(45) Date of Patent: Nov. 25, 2003

(54) METHOD AND APPARATUS FOR CUTTING A NON-METALLIC SUBSTRATE USING A LASER BEAM

(75) Inventors: Dae-Ho Choo, Suwon-si (KR); Baek-Kyun Jeon, Yongin-si (KR); Hyung-Woo Nam, Yongin-si (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/150,971

(22) Filed: May 21, 2002

(65) Prior Publication Data

US 2002/0170896 A1 Nov. 21, 2002

(30) Foreign Application Priority Data

May 21, 2001 (KR) .......................... 2001-27677

(51) Int. Cl.[7] .......................... H01L 21/46; H01L 21/78; H01L 21/301
(52) U.S. Cl. .................. 438/460; 438/463; 219/121.67; 219/121.72
(58) Field of Search ................................ 438/460, 463; 219/121.6, 121.67, 121.72

(56) References Cited

U.S. PATENT DOCUMENTS

| | | | | |
|---|---|---|---|---|
| 5,698,121 A | * | 12/1997 | Kosaka et al. | 219/121.67 |
| 5,916,640 A | * | 6/1999 | Liu et al. | 427/245 |
| 6,407,360 B1 | * | 6/2002 | Choo et al. | 219/121.67 |
| 6,420,245 B1 | * | 7/2002 | Manor et al. | 438/460 |
| 6,448,534 B1 | * | 9/2002 | Kobsa | 219/121.72 |
| 6,541,730 B2 | * | 4/2003 | Nam et al. | 219/121.67 |
| 6,555,447 B2 | * | 4/2003 | Weishauss et al. | 438/460 |
| 2001/0035401 A1 | * | 11/2001 | Manor | 219/121.72 |
| 2002/0046997 A1 | * | 4/2002 | Nam et al. | 219/121.72 |

* cited by examiner

*Primary Examiner*—Alexander Ghyka
(74) *Attorney, Agent, or Firm*—McGuireWoods LLP

(57) ABSTRACT

A method and an apparatus for cutting a non-metallic substrate by a laser are disclosed. In the disclosed method and apparatus, a first laser beam for breaking molecular bonds of the non-metallic substrate material is scanned on a cutting path formed on the non-metallic substrate to form a scribe line having a crack in desired depth. Then, a second laser beam is scanned along a scanning path of the first laser beam to propagate the crack in a depth direction of the substrate and to completely separate the non-metallic substrate. Since the cutting speed can be controlled by the speed of the first laser beam, the cutting speed can be increased and the cutting speed can be easily controlled as compared with the conventional cutting method using the temperature difference due to the heating operation and the cooling operation.

7 Claims, 4 Drawing Sheets

METHOD AND APPARATUS FOR CUTTING A NON-METALLIC SUBSTRATE USING A LASER BEAM

BACKGROUND OF THE INVENTION

1. Field of the Invention

The present invention relates to a method and apparatus for cutting a non-metallic substrate, by which the non-metallic substrate formed of a non-metal material such as glass and silicon is precisely separated into a plurality of small pieces, and more particularly, to a method and apparatus for cutting the non-metallic substrate, in which the non-metallic substrate formed of the glass and the silicon is completely cut using only a scribing laser beam and a breaking laser beam without a cooling device.

2. Description of the Related Art

In recent years, the semiconductor industry, which fabricates a highly-integrated and high-performance semiconductor product, has continued to develop along with a semiconductor thin film processing technique. The semiconductor product has anywhere from a few to a few tens of million semiconductor devices that are integrated on a high-purity substrate called a "wafer" that is made of single crystalline silicon, as one of a non-metal material, by the semiconductor thin film processing technique. The semiconductor product serves to store data in digital form or to quickly operate the stored data.

Further, as one of the semiconductor industry applications, a liquid crystal display (LCD) for displaying an analog video signal processed by a data processing unit into digital form has been rapidly developed. In the LCD, liquid crystal is injected between two transparent substrates. A voltage is applied to a certain molecular alignment of the liquid crystal to transform the molecular alignment into that of another. The optical property, such as double refractivity, optical rotary power, dichroism and light scattering, of a liquid crystal cell is changed by the molecular alignment.

The semiconductor product and the LCD have a common feature in that they are formed on a non-metallic substrate, i.e., a high-purity silicon substrate and a glass substrate. Unfortunately, the non-metallic substrate is subject to shock and quite fragile. However, a plurality of semiconductor chips or LCD unit cells are formed on a sheet of wafer or a large-sized glass substrate and then easily separated into each piece.

In the case of the semiconductor product, after forming anywhere from a few to a few hundred semiconductor chips on a sheet of wafer at the same time, and cutting into each chip through a separating process, the semiconductor chip is packaged to produce the semiconductor product.

In the case of the LCD, after forming at least two or more LCD unit cells on the large-sized glass substrate called a motherboard, the LCD unit cell is separated from the motherboard by a separating process, and then they are assembled. At this time, since the separating process occurs during a last step of a production process, a defect in the separating process negatively impacts the productivity and yield of the product. Particularly, the motherboard used for the LCD does not have a crystal structure having the property of glass, the brittleness of the motherboard is lower than that of a silicon wafer. A fine crack is formed at an edge portion of the motherboard during the separating process. The stress is amplified along the crack during a next process used to form the motherboard. Therefore, a defect is easily generated in which an undesired portion of the motherboard is cut.

In the conventional art, a diamond blade, in which a circular plate having a desired diameter is studded with fine diamonds at a circumferential surface thereof and rotated at a high speed, is contacted with a "cutting path" using friction to form a scribe line at a desired depth on a surface of the substrate along the cutting path. Then, a physical impact is applied to the substrate so that a crack is propagated along the scribe line to a lower face of the substrate, thereby separating the semiconductor chip or the LCD unit cell from the wafer or the glass motherboard.

When the wafer or the glass motherboard is separated using the diamond blade, it is necessary to use a cutting margin, which is a desired surface area for the cutting process. Therefore, if the cutting process is not precisely performed, the number of obtained semiconductor chips per a unit wafer decreases due to waste.

Particularly, in the case of the LCD, since a cut face by the diamond blade is roughly formed, many portions on which stresses are concentrated are formed on the cut face. The stress concentration portion of the cut face is easily broken by only a slight impact applied from the outside, so that a crack or a chipping is vertically generated to the cut face.

Further, since the diamond blade generates so many glass particles, an additional cleaning and drying process is required to remove the glass particles. This is disadvantageous to production efficiency.

Recently, to solve the problem, cutting methods using a laser beam have been suggested. For example, U.S. Pat. No. 4,467,168, entitled "Method of Cutting Glass with a Laser and an Article Made Therewith", U.S. Pat. No. 4,682,003, entitled "Laser Beam Glass Cutting" and U.S. Pat. No. 5,622,540, entitled "Method of Breaking a Glass Sheet" disclose such methods. Since the cutting method using the laser beam is a non-contact type, the vertical crack formed perpendicularly to the cut face is not generated as compared with the cutting method of a contact type using friction with the diamond blade.

FIG. 1 is a view of a conventional laser cutting apparatus for cutting a glass substrate using a laser beam.

As shown in FIG. 1 a scribing laser beam 13, for example a $CO_2$ laser beam having an absorptivity of 95% or more with respect to the glass, is scanned along a cutting path 12 formed on a glass motherboard 10 so as to rapidly heat the cutting path 12 of the motherboard 10.

Then, a cooling fluid beam 14 having a markedly lower temperature than the heating temperature of the glass motherboard 10 is applied onto the rapidly heated cutting path 12. Accordingly, while the glass motherboard 10 is rapidly cooled, a crack is generated on a surface of the motherboard 10 to a desired depth to generate a scribe line 15. Also, the cooling fluid beam 14 may be positioned to be apart from the scribing laser beam 13 at a desired distance or to be adjacent to the scribing laser beam 13. Otherwise, the cooling fluid beam 14 may be positioned at an inner portion of the scribing laser beam 13.

Subsequently, a breaking laser beam 16, such as the $CO_2$ laser beam, is linearly scanned along the scribe line 15 so as to heat the scribe line 15 rapidly. Thus, a strong tensile force is generated at the scribe line 15 in the direction shown in FIG. 1, so that the glass motherboard 10 is completely cut off along the scribe line 15. Meanwhile, the breaking laser beam 16 is symmetrically applied with respect to the scribe line 15 to heat both sides of the scribe line 15 rapidly.

The conventional laser cutting apparatus, as described above, is mainly comprised of a laser beam generating portion and a cooling portion so as to heat a non-metallic substrate, such as the glass having a low thermal conductivity, using the laser beam and then rapidly cool the heated portion of the non-metallic substrate. Therefore, a thermal stress is propagated to a heat moving direction, so that the substrate is cut.

However, in the conventional laser cutting apparatus, the substrate has to be cooled rapidly, using a cooling material in gaseous or liquid state, after being scanned by the scribing laser in order to induce sudden temperature changes. This limits the cutting speed of the substrate.

In order to out the glass such as Borosilicate glass (BSG) having a thermal conductivity of 0.26 kcal/mh° C. (the thermal conductivity of metal is 57 kcal/mh° C.), the laser beam should be condensed. However, since laser beam energy applied to each unit surface area is inversely proportional to the cutting speed, increasing the cutting speed causes the laser beam energy applied to each unit surface area to be lowered, even if the laser beam is condensed. Therefore, the substrate may not be fully cut. Accordingly, the cutting method using the high harmonics laser beam is inferior with respect to the cutting speed as compared with the conventional mechanical cutting method that controls the cutting speed by increasing a mechanical speed.

Further, since the propagating method of the thermal stress has to generate a micro-crack at an early stage of the cutting process, an initial crack should be generated at an initial cutting point by a physical force using the scribing laser beam such as the $CO_2$ laser beam, or by a laser beam based on an impact energy such as YAG. Therefore, a fabricating cost is disadvantageously increased, because the laser cutting apparatus has total three laser generating portions, to include the laser for generating the initial crack, the scribing laser and the breaking laser. Moreover, if a laser head is moved by a repeat operation of the cutting equipment, the initial crack is inconsistent with the scribe line. Therefore, the cutting process has a defect in that a cut line is irregularly formed at a starting portion of the substrate.

In addition, in the conventional cutting method using the laser beam described above, since the cooling material such as water, dry ice, helium gas, etc., is positively necessary, a contamination caused by the coolant may cause a problem. That is, when the glass motherboard in which a cut piece is used in the LCD, the remaining coolant is introduced to a liquid crystal injecting port after the cutting operation, thereby generating a defect in a liquid crystal injecting process. Therefore, a further process is essentially required to remove the remaining cooling material after completing the cutting operation. Moreover, if gas is used as the cooling material, since the gas has a lower density than a liquid material, the gas should have a lower temperature than a liquid cooling material to increase cooling efficiency. However, if the gas temperature is lower than the ambient temperature, it quickly lowers the ambient temperature during the cutting operation, condensing the moisture around. This moisture causes defects in the cutting process.

SUMMARY OF THE INVENTION

Therefore, it is an object of the present invention to provide a method of cutting a non-metallic substrate made of glass or silicon, in which the non-metallic substrate is completely cut by using only a scribing laser beam and a breaking laser beam without a cooling device.

It is another object of the present invention to provide an apparatus for cutting a non-metallic substrate, which properly performs the cutting method.

To achieve the aforementioned objects of the present invention, there is provided a method of cutting a non-metallic substrate, which comprises the steps of scanning a first laser beam for breaking bonds between molecules of the non-metallic substrate material on a cutting path formed on the non-metallic substrate to form a scribe line having a crack to a desired depth, and scanning a second laser beam along a scanning path of the first laser beam to propagate the crack in a depth direction of the substrate and to completely separate the non-metallic substrate.

To achieve another object of the present invention, there is provided an apparatus for cutting a non-metallic substrate, which comprises a first laser beam generating means, which generates a first laser beam for breaking bonds between molecules of the non-metallic substrate material so as to heat a cutting path formed on the non-metallic substrate and to form a scribe line having a crack to a desired depth, and a second laser beam generating means, which generates a second laser beam for propagating the crack along a scanning path of the first laser beam in a depth direction of the substrate.

According to the present invention as described above, the first laser beam having a wavelength identical with a natural frequency of the non-metallic substrate is used for breaking the molecular bonds of the non-metallic substrate. A scribe line having a narrow and deep crack is formed on the cutting path of the non-metallic substrate, for example a glass, by the first laser beam, e.g., the $4^{th}$ harmonic yttrium aluminum garnet (YAG) laser beam having a wavelength of 266 nm and an absorptivity of 90% and more with respect to the non-metallic substrate. Then, the $CO_2$ laser beam as the second laser beam is scanned onto the scribe line to propagate the crack in the depth direction of the substrate and to completely cut the non-metallic substrate.

Accordingly, the cutting apparatus has only a scribing laser (the first laser) and a breaking laser (the second laser) without the cooling device, thereby simplifying a structure thereof and reducing the fabricating cost in comparison with a conventional one.

Further, since a cutting speed can be controlled by a speed of the first laser beam, the cutting speed can be increased and controlled with ease as compared with the conventional cutting method using the temperature difference due to the heating and the cooling operation.

Moreover, the cooling device is not employed in the cutting apparatus of an embodiment of the present invention, thereby preventing the process defect such as the contamination of the liquid crystal injecting port after the cutting operation.

BRIEF DESCRIPTION OF THE DRAWINGS

The above objects and other advantages of the present invention will become more apparent by describing in detail preferred embodiments thereof with reference to the attached drawings.

DESCRIPTION OF THE PREFERRED EMBODIMENTS

Now, preferred embodiments of the present invention will be described in detail with reference to the annexed drawings.

Figure 1:
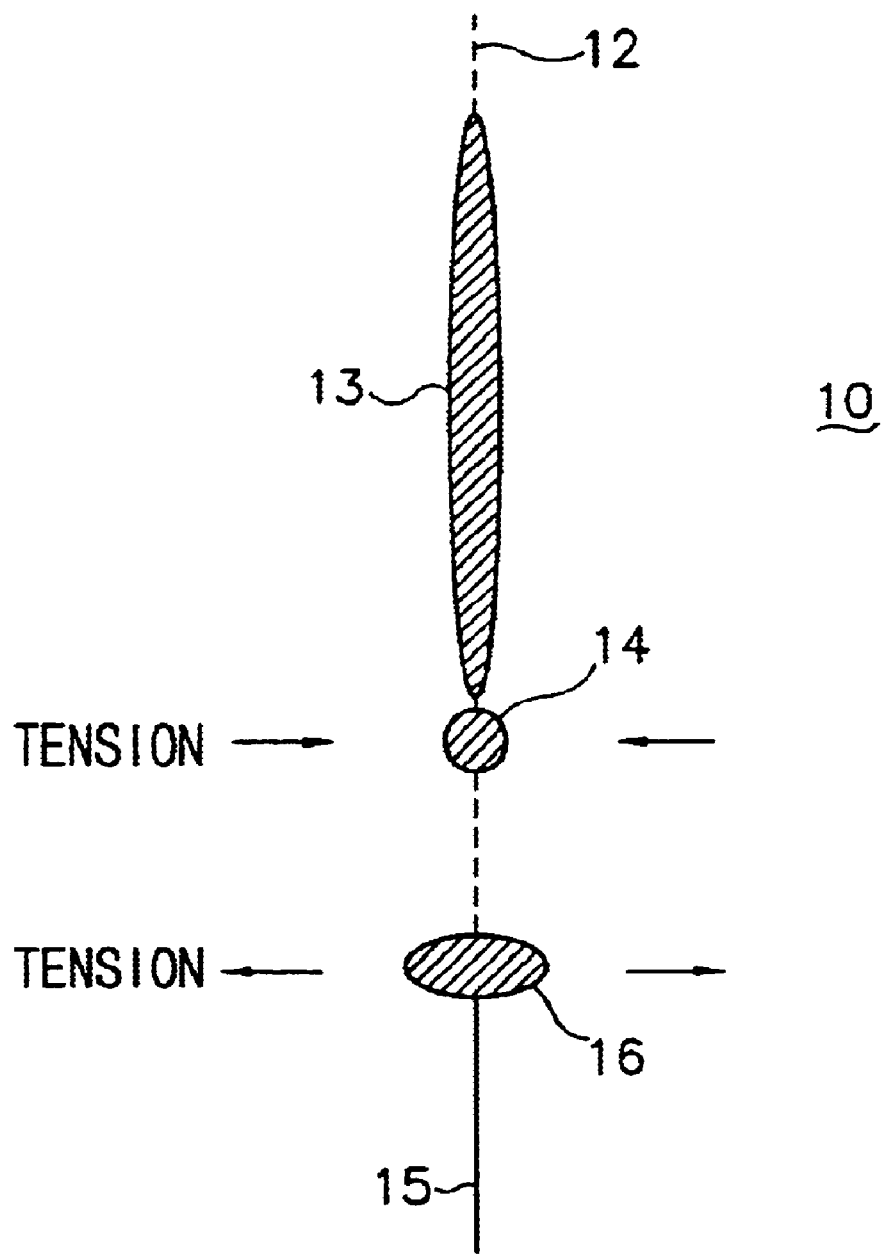
FIG. 1 is a view of a conventional laser cutting apparatus for cutting a glass substrate using a laser beam.
Figure 2:
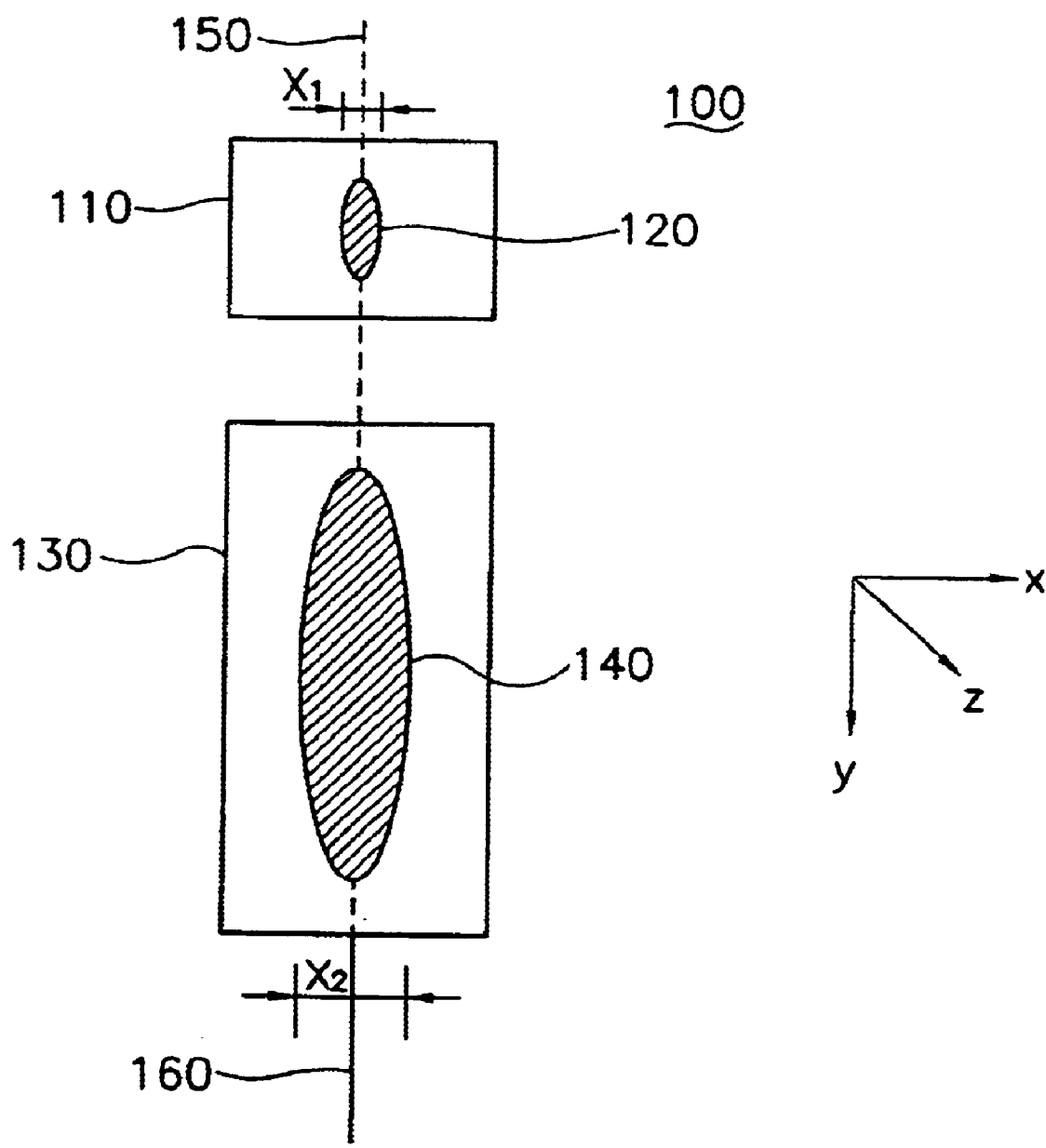
FIG. 2 is a view showing a cutting mechanism of an apparatus for cutting the glass substrate according to one preferred embodiment of the present invention.

FIG. 2 is a view showing a cutting mechanism of an apparatus for cutting a glass substrate according to one preferred embodiment of the present invention.

Referring to FIG. 2, an apparatus for cutting a glass substrate according to one embodiment of the present invention includes a laser beam generating unit for generating a laser beam to heat a cutting path 150 of a glass mother substrate 100, and a conveying unit (not shown) for conveying the laser beam generating unit to move relative to the glass motherboard 100.

The laser beam generating unit includes a first laser beam generating member 110 for providing a first laser beam 120 to heat the cutting path 150 and to form a scribe line 160 having a crack to a desired depths and further includes a second laser beam generating member 130 for providing a second laser beam 140 to propagate the crack along a scanning path of the first laser beam 120 in a depth direction of the substrate 100.

The first laser beam 120 has a wavelength identical to an inherent frequency of the glass to break molecular bonds between glass molecules of the glass mother substrate 100. The first laser beam heats the cutting path 150 of the glass mother substrate 100 to generate the crack to a desired depth from the substrate surface of the cutting path 150 and to form the scribe line 160. Preferably, the first laser beam 120 is formed by a $4^{th}$ harmonic YAG laser beam having an oscillating wavelength of 166 nm and an absorptivity of 90% or more with respect to the glass. Due to having a wavelength identical to the inherent frequency of the glass mother substrate 100, the $4^{th}$ harmonic YAG laser beam breaks the molecular bonds between the molecules of the glass mother substrate 100 and generates a surface crack (referring to FIG. 4, reference numeral 180) with respect to all of the scribe lines 160.

The YAG laser is a typical solid-state laser like a ruby laser and it has a chemical composition of $Nd:Y_3Al_5O_{12}$, in which $Nd^{3+}$ ion of about 1% is contained in YAG crystal instead of $Y^{3+}$ ion, to generate a near infrared wavelength. The YAG laser can generate a laser beam having nth harmonics by using a device for generating harmonics, and thereby obtaining a $2^{nd}$ harmonic YAG laser having a wavelength of 532 nm, a $3^{rd}$ harmonic YAG laser having a wavelength of 355 nm and a $4^{th}$ harmonic YAG laser having a wavelength of 266 nm.

Figure 3:
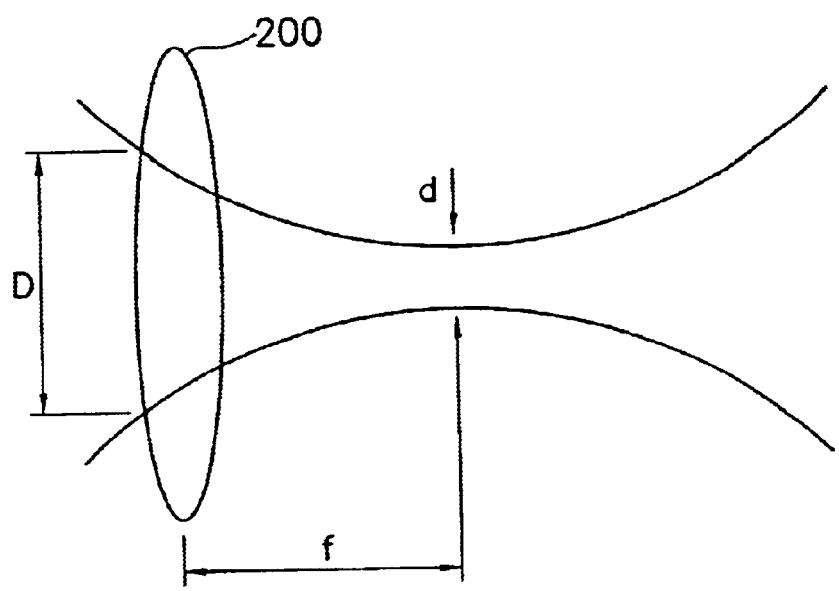
FIG. 3 is a view showing characteristics of a $4^{th}$ harmonic YAG laser used in an embodiment of the present invention.

FIG. 3 is a view showing characteristics of a $4^{th}$ harmonic YAG laser used in an embodiment of the present invention.

Referring to FIG. 3, a spot size "d" of the $4^{th}$ harmonic YAG laser beam that is incident through a convex lens 200 can be calculated by the following equation:

$$d = \frac{4f\lambda M^2}{\pi D},$$

where "f" is a focal distance of the lens, "λ" is a wavelength of the laser beam, M is a material constant, which is dependent on the kind of the laser, and D is an output width of the laser beam.

As shown in the above equation, since the spot size "d" is in proportion to the wavelength of the laser beam, as the wavelength becomes shorter, the spot size becomes smatter. Therefore, the shorter wavelength increases the beam intensity. The $3^{rd}$ harmonic YAG laser beam used as the laser beam for generating an initial crack in the conventional laser cutting apparatus has a wavelength of 355 nm, which is longer than that of the $4^{th}$ harmonic YAG laser beam used in a preferred embodiment of the present invention, and has a spot size of 25 μm.

On the contrary, since the $4^{th}$ harmonic YAG laser used in a preferred embodiment of the present invention has the wavelength of 266 nm shorter than that of the $3^{rd}$ harmonic YAG laser, the spot size of the $4^{th}$ harmonic YAG laser becomes 10 μm, which is smaller than the spot size of the $3^{rd}$ harmonic YAG laser, that is 25 μm.

Figure 4:
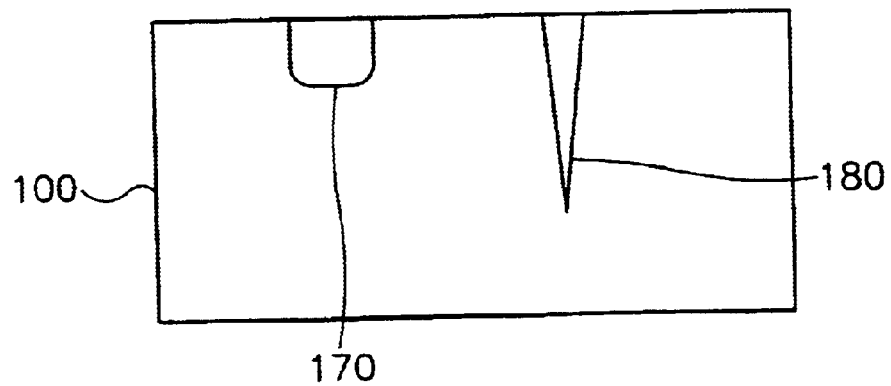
FIG. 4 is a cross-sectional view of crack shapes formed on the glass motherboard by a $3^{rd}$ harmonic YAG laser and a $4^{th}$ harmonic YAG laser.

In order to increase a scribing accuracy, preferably the condensed laser beam has a smaller diameter. Thus, as shown in FIG. 4, since the spot size of the $4^{th}$ harmonic YAG laser beam is smaller than that of the $3^{rd}$ harmonic YAG laser beam, a contact surface area between the glass mother substrate 100 and the laser beam is reduced to generate a sharp and deep crack. That is, a crack 170 caused by the $3^{rd}$ harmonic YAG laser beam, having the spot size of about 25 μm, is widely and shallowly formed on the glass mother substrate 100. However, a crack 180 caused by the $4^{th}$ harmonic YAG laser beam, having the spot size of about 10 μm, is formed sharp and deeply. Thus, an occurrence of a fine crack perpendicular to the cutting path 150 is prevented (see FIG. 2), thereby improving the quality of a cut face after the cutting process.

Figure 5:
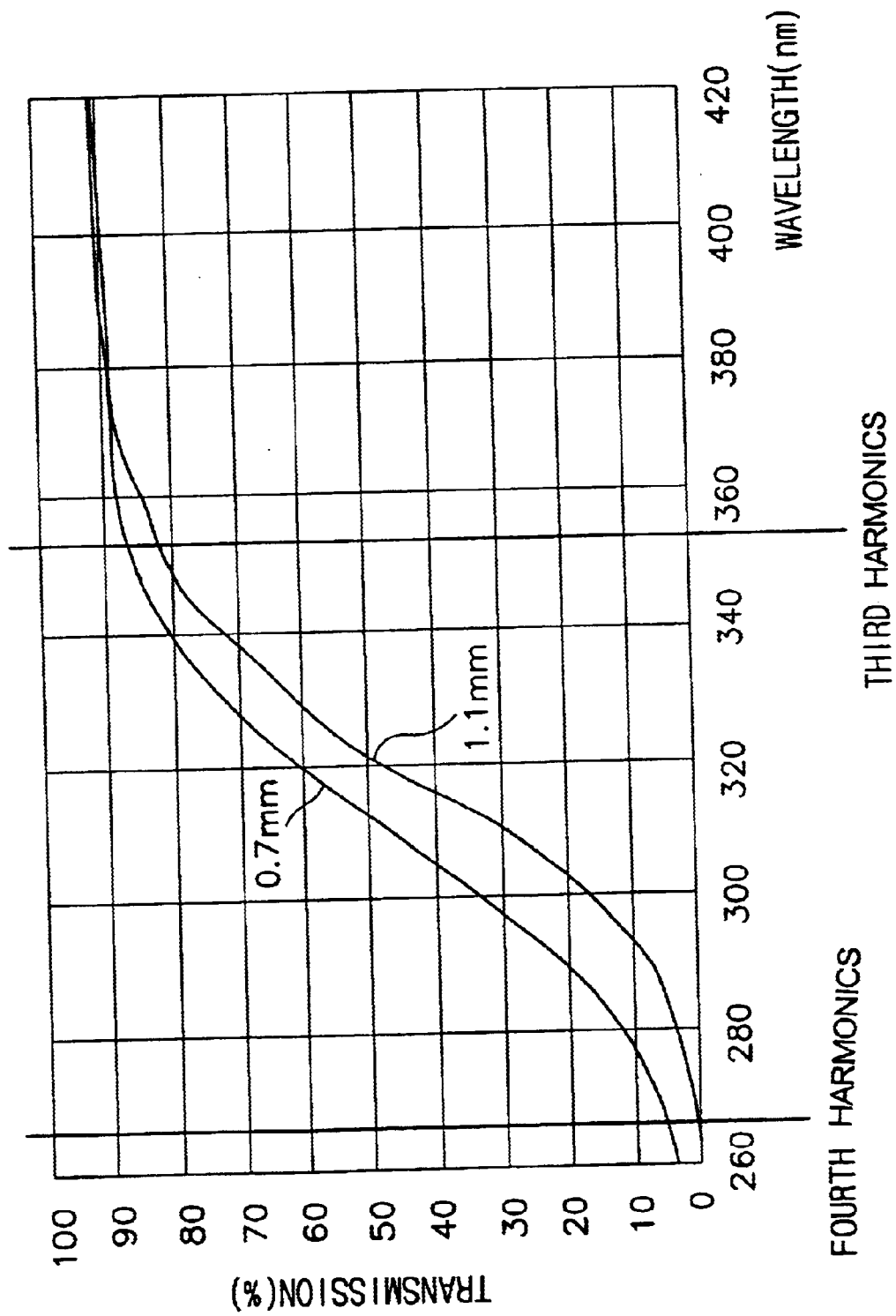
FIG. 5 is a graph showing a transmittance of the $3^{rd}$ harmonic YAG laser and the $4^{th}$ harmonic YAG laser with respect to the glass.

FIG. 5 is a graph showing a transmittance versus wavelength of the $3^{rd}$ harmonic YAG laser (wavelength of 355 nm) and the $4^{th}$ harmonic YAG laser used in a preferred embodiment of the present invention (wavelength of 266 nm) (having a thickness of 0.7 mm and 1.1 mm, respectively) with respect to the glass. In FIG. 5, the latitudinal axis of the graph is a wavelength of the laser beam (in nm), and the longitudinal axis is a transmission (in %) of the laser beam.

Referring to FIG. 5, since the $3^{rd}$ harmonic YAG laser used in a conventional laser cutting apparatus has a transmission of about 85% with respect to the glass of 0.7 mm, and has a transmission of about 80% with respect to the glass of 1.1 mm, the YAG laser has a low absorptivity of about 10% to 15%. On the contrary, since the $4^{th}$ harmonic YAG laser used in a preferred embodiment of the present invention has a transmittance of about 5% with respect to the glass of 0.7 mm, and has a transmission of about 1% with respect to the glass of 1.1 mm, the YAG laser used in a preferred embodiment of the present invention has a high absorptivity of about 90 to 97%.

Therefore, the scribing on the glass mother substrate 100 by the $4^{th}$ harmonic YAG laser beam makes the scribe line 160 formed sharply and deeply due to the high absorptvity and also due to an increased scribing speed. For example, when cutting an LCD panel of the glass having the thickness of 0.7 mm by the laser cutting apparatus according to an embodiment of the present invention, the speed for full cutting can be increased to 400 mm/sec. Further, since cooling means are not required in the cutting apparatus, the cutting speed can be controlled by only the speed of the first laser beam 120. Therefore, the cutting speed is easily controlled when compared with that of the conventional cutting method using a temperature difference by a rapid heating operation and a rapid cooling operation.

The second laser beam 140, which is a high power laser beam like the $CO_2$ laser beam, has an elliptical beam pattern having desired short and long axes and is scanned on the glass mother substrate 100 so that the long axis of the pattern is aligned with the cutting path 150 (see FIG. 2). The second laser beam 140 is placed apart from the first laser beam 120 at a desired distance and scanned on the glass substrate 100 along a scanning path of the first laser beam 120. Preferably, the second laser beam 140 is scanned on the scribe line 160 that is formed on the cutting path of the glass mother substrate 100 by the first laser beam 120. At this time, if the scribe line 160 is heated over a fusing point of the glass, a portion in which the crack is generated is junctioned again. Therefore, the second laser beam 140 has to be scanned at a temperature that is equal to or below the fusing point of the glass.

Further, referring to FIG. 2, the second laser beam 140 has a width, $x_2$, i.e., the length of the short axis, that is wider than a width, $x_1$, i.e., the length of the short axis of the first laser beam 120. The second laser beam 140 is scanned so as to have a depth shallower than that of the first laser beam 120. As used herein, the depth of the laser beam means the intensity of the laser beam per unit surface area.

The first laser beam 120 has to be scanned as narrowly and deeply as possible to form the crack on the cutting path 160 of the glass mother substrate 100. On the other side, since the second laser beam 140 is scanned to completely cut the glass mother substrate 100 along the cutting path 150, the second laser beam 140 has to be scanned more widely and shallowly than the first laser beam 120 so as to prevent an unnecessary crack from generating on the glass mother substrate 100, except for the cutting path 150.

A beam profile of the second laser beam 140 can be transformed through a cylindrical lens in which a concave lens and a convex lens are combined. That is, in the case of using the cylindrical lens of which an upper face is formed as the concave lens and a lower face is formed as the convex lens, if a spot-shaped laser beam is incident to the concave lens, the laser beam is transformed from the spot shape into an elongated ellipse shape having the short and long axes. If the transformed laser beam is passed through the convex lens, the short axis is shortened to form a more elongated ellipse shape having the elongated long axis compared with its short axis.

According to the laser cutting apparatus of an embodiment of the present invention as described above, the cutting apparatus comprises the scribing laser (the first laser) and the breaking laser (the second laser) without a cooling device, thereby simplifying the structure thereof and reducing a fabricating cost as compared with the conventional laser cutting apparatus. Further, the cutting apparatus of an embodiment of the present invention does not employ the cooling device, thereby preventing a process defect such as contamination of a liquid crystal injecting port after the cutting operation.

Now, a method of cutting the glass mother substrate 100 using the cutting apparatus shown in FIG. 2 is described more fully.

First, the first laser beam 120 is scanned along the cutting path 150 set up on the glass mother substrate 100 to form the cutting path 150. Since the first laser beam 120 has the same wavelength as the natural frequency of the glass mother substrate 100, the first laser beam 120 breaks the molecular bonds of the glass mother substrate 100 to generate the narrow and deep crack on a surface of the cutting path 150. Therefore, the scribe line 160 having the crack is formed along the cutting path 150 in a desired depth.

While the first laser beam 120 is continuously advanced along the cutting path 150, the second laser beam 140 is scanned along a scanning path of the first laser beam 120 to rapidly heat the scribe line 160. That is, the second laser beam 140 is directly scanned on the scribe line 160.

Then, a thermal gradient is rapidly generated only in a depth direction of the glass mother substrate 100. Accordingly, the crack formed on the surface of the scribe line 160 is straight and propagated to a lower face of the glass mother substrate 100 to completely separate the glass mother substrate 100.

In the conventional laser cutting apparatus using the cooling device, since the fine crack is formed using the temperature difference due to the rapid heating and the rapid cooling, an object to be cut such as the glass mother substrate, has to be locally and rapidly heated. Therefore, since heat transfer to a portion that is not heated by the laser beam should be reduced, a thermal conductivity of the object to be cut becomes an important factor and the object to be cut is limited to the glass and a ceramic material having a low thermal conductivity.

On the contrary, according to the cutting apparatus of an embodiment of the present invention, since the crack is directly formed at the object like the mother glass, by the first laser beam such as the $4^{th}$ harmonic YAG laser beam, the thermal conductivity of the object to be cut is not so important as compared with the conventional cutting apparatus. Thus, the laser cutting apparatus of an embodiment of the present invention can be applied to the cutting method of a silicon wafer as well as to glass and ceramic materials.

According to an embodiment of the present invention as described above, the first laser beam has a wavelength identical with the natural frequency of the non-metallic substrate (i.e., the first laser beam is capable of breaking the molecular bonds of the nonmetallic substrate material). The scribe line having the narrow and deep crack is formed on the cutting path of the non-metallic substrate using the first laser beam, such as the $4^{th}$ harmonic YAG laser beam having the wavelength of 266 nm and the absorptivity of 90% and more with respect to the non-metallic substrate. Then, the second laser beam, such as the $CO_2$ laser beam, is scanned on the scribe line to propagate the crack in the depth direction of the substrate and to completely separate the non-metallic substrate.

Accordingly, the cutting apparatus comprises only the scribing laser (the first laser) and the breaking laser (the second laser) without the cooling device, thereby simplifying the structure thereof and reducing the fabricating cost as compared with the conventional apparatus.

Further, since the cutting speed can be controlled by the speed of the first laser beam, the cutting speed can advantageously be increased and can be easily controlled as compared with the conventional cutting method using the temperature difference due to the heating and the cooling operation.

Moreover, the cooling device is not employed in the cutting apparatus of an embodiment of the present invention, thereby preventing the process defeat such as the contamination of the liquid crystal injecting port after the cutting operation.

While the present invention has been described in detail, it should be understood that various changes, substitutions and alterations could be made hereto without departing from the spirit and scope of the invention as defined by the appended claims.

What is claimed is:

1. A method for cutting a non-metallic substrate, comprising the steps of:
   scanning a first laser beam for breaking molecular bonds of the non-metallic substrate material on a cutting path formed on the non-metallic substrate to form a scribe line having a crack to a desired depth; and
   scanning a second laser beam along a scanning path of the first laser beam to propagate the crack in a depth direction of the substrate and to completely separate the non-metallic substrate.

2. The method of claim 1, wherein the first laser beam has a wavelength having an absorptivity of 90% or more with respect to the non-metallic substrate.

3. The method of claim 2, wherein the non-metallic substrate is a glass, and the first laser beam is a $4^{th}$ harmonics YAG laser beam having a wavelength of 266 nm.

4. The method of claim 1, wherein the first laser beam is scanned from a starting point of the cutting path to an end point of the cutting path.

5. The method of claim 1, wherein the second laser beam is a $CO_2$ laser beam.

6. The method of claim 1, wherein the first laser beam has a width less than that of the second laser beam.

7. The method of claim 1, wherein the second laser beam is directly scanned onto the scribe line.

* * * * *